(12) United States Patent
Peterson et al.

(10) Patent No.: US 10,453,643 B2
(45) Date of Patent: Oct. 22, 2019

(54) SHIELDED, TRANSMISSION-TARGET, X-RAY TUBE

(71) Applicant: Moxtek, Inc., Orem, UT (US)

(72) Inventors: Dustin Peterson, Spanish Fork, UT (US); Richard Zimmerman, Payson, UT (US); Rick Steck, West Jordan, UT (US); Vince Jones, Cedar Hills, UT (US); Eric Miller, Provo, UT (US)

(73) Assignee: Moxtek, Inc., Orem, UT (US)

(*) Notice: Subject to any disclaimer, the term of this patent is extended or adjusted under 35 U.S.C. 154(b) by 496 days.

(21) Appl. No.: 15/419,620

(22) Filed: Jan. 30, 2017

(65) Prior Publication Data

US 2017/0287673 A1    Oct. 5, 2017

Related U.S. Application Data

(60) Provisional application No. 62/315,472, filed on Mar. 30, 2016.

(51) Int. Cl.
*H01J 35/18* (2006.01)
*H01J 35/16* (2006.01)
(Continued)

(52) U.S. Cl.
CPC .......... *H01J 35/186* (2019.05); *H01J 35/064* (2019.05); *H01J 35/16* (2013.01); *H01J 35/18* (2013.01);
(Continued)

(58) Field of Classification Search
CPC .......... H01J 35/00; H01J 35/02; H01J 35/025; H01J 35/04; H01J 35/064; H01J 35/08;
(Continued)

(56) References Cited

U.S. PATENT DOCUMENTS

2012/0148027 A1    6/2012 Jeong et al.
2013/0016812 A1*   1/2013 Yanagisawa ............ H01J 35/16
                                                        378/62
(Continued)

FOREIGN PATENT DOCUMENTS

EP          2779203 A2    9/2014

*Primary Examiner* — Anastasia Midkiff
(74) *Attorney, Agent, or Firm* — Thorpe, North 7 Western, LLP

(57) ABSTRACT

A transmission-target x-ray tube can include an x-ray window mounted on a window-housing. The window-housing can be made of a high density material (e.g. ≥12 g/cm³) with a high atomic number (e.g. ≥45), and can include an aperture with an increasing-inner-diameter region, with a smaller diameter closer to the electron-emitter and a larger diameter closer to the window-mount, for blocking x-rays and electrons. An example angle in the increasing-inner-diameter region is between 15 degrees and 35 degrees. The x-ray tube can further comprise a window-cap. The x-ray window can be sandwiched between the window-housing and the window-cap. The window-cap can be made of a high density material (e.g. ≥12 g/cm³) with a high atomic number (e.g. ≥45) for blocking x-rays in undesirable directions, and can include an aperture for allowing x-rays to transmit in desirable directions.

20 Claims, 5 Drawing Sheets

Figure 1:
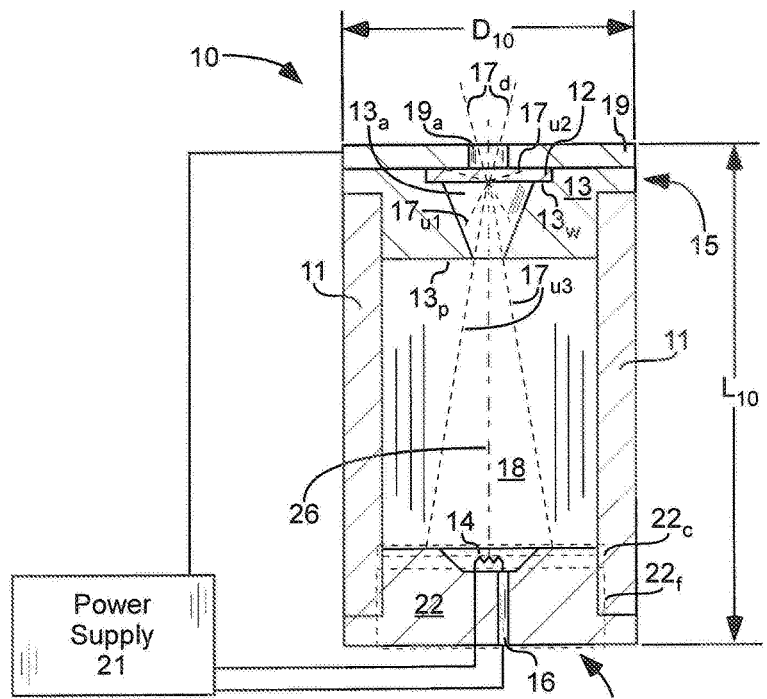

(51) Int. Cl.
*H01J 35/06* (2006.01)
*H01J 37/16* (2006.01)
*H01J 35/08* (2006.01)

(52) U.S. Cl.
CPC ........... *H01J 37/165* (2013.01); *H01J 35/116* (2019.05); *H01J 2235/081* (2013.01); *H01J 2235/083* (2013.01); *H01J 2235/084* (2013.01); *H01J 2235/165* (2013.01); *H01J 2235/183* (2013.01); *H01J 2237/032* (2013.01)

(58) Field of Classification Search
CPC ........ H01J 35/112; H01J 35/116; H01J 35/14; H01J 35/16; H01J 35/18; H01J 35/186; H01J 35/24; H01J 35/30; H01J 35/32; H01J 37/00; H01J 37/02; H01J 37/16; H01J 37/165; H01J 2237/00; H01J 2237/02; H01J 2237/0203; H01J 2237/03; H01J 2237/032; H01J 2237/04; H01J 2237/16; H01J 2235/00; H01J 2235/08; H01J 2235/081; H01J 2235/083–086; H01J 2235/16; H01J 2235/163; H01J 2235/165; H01J 2235/166; H01J 2235/168; H01J 2235/18; H01J 2235/183
See application file for complete search history.

(56) References Cited

U.S. PATENT DOCUMENTS

| | | |
|---|---|---|
| 2013/0195253 A1 | 8/2013 | Andrews |
| 2014/0140480 A1 | 5/2014 | Ogura et al. |
| 2015/0124936 A1 | 5/2015 | Anno et al. |
| 2015/0303024 A1 | 10/2015 | Harker et al. |
| 2016/0228076 A1* | 8/2016 | Utsumi ................... A61B 6/02 |

* cited by examiner

US 10,453,643 B2

SHIELDED, TRANSMISSION-TARGET, X-RAY TUBE

CLAIM OF PRIORITY

This application claims priority to U.S. Provisional Patent Application No. 62/315,472, filed on Mar. 30, 2016, which is incorporated herein by reference in its entirety.

FIELD OF THE INVENTION

The present application is related generally to x-ray tubes.

BACKGROUND

X-rays can be useful for many applications, including without limitation imaging, electrostatic dissipation, x-ray fluorescence, and x-ray diffraction, but x-rays can also be harmful. X-ray sources can emit x-rays in all directions, including undesirable, and potentially-harmful, directions. It can be important, therefore to block x-rays emitted in undesirable directions.

Thick, high-density materials may be needed for blocking x-rays. The cost of such materials can be undesirable. The weight and size of such materials can be undesirable, especially in portable x-ray tubes.

X-ray tubes can include an electron-emitter that emits electrons towards a target material. The electron-emitter can emit these electrons due to a large voltage between the electron-emitter and the target. An electrically-insulative enclosure, such as glass or ceramic, can separate the electron-emitter from the target. When these electrons hit the target, x-rays and additional electrons are emitted. Some of these additional electrons can fly back into an evacuated region between the target and the electron-emitter, and can hit and be adsorbed onto a surface of the electrically-insulative enclosure. An electrical arc can cause failure of the x-ray tube if enough electrons are thus adsorbed.

SUMMARY

It has been recognized that it would be advantageous to block x-rays emitted from x-ray tubes in undesirable directions, with minimal increase in x-ray tube size, weight, and cost. It has been recognized that it would be advantageous to avoid electron-adsorption onto an inner surface of an electrically-insulative enclosure of the x-ray tube. The present invention is directed to various embodiments of transmission-target x-ray tubes that satisfy these needs. Each embodiment may satisfy one, some, or all of these needs.

The transmission-target x-ray tube can comprise an anode including a window-housing and an x-ray window and a cathode including an electron-emitter capable of emitting electrons towards a target material on the x-ray window. The x-ray window can be mounted on a window-mount portion of the window-housing. The window-housing can include a proximal-end, located closer to the electron-emitter; and the window-mount can be located farther from the electron-emitter than the proximal-end. An aperture can extend through the window-housing from the proximal-end to the window-mount and can include an increasing-inner-diameter region with a smaller diameter closer to the proximal-end and a larger diameter closer to the window-mount. The window-housing can have a high average atomic number, such as for example at least 45. The window-housing can have a high average density, such as for example at least 12 g/cm$^3$.

BRIEF DESCRIPTION OF THE DRAWINGS (DRAWINGS MIGHT NOT BE DRAWN TO SCALE)

FIG. 1 is a schematic, cross-sectional side-view of an x-ray source including a transmission-target x-ray tube 10 and a power supply 21. The transmission-target x-ray tube 10 includes a cathode 27 with an electron-emitter 14, and an anode 15 with a window-housing 13 and an x-ray window 12, in accordance with an embodiment of the present invention.

Figure 2A:
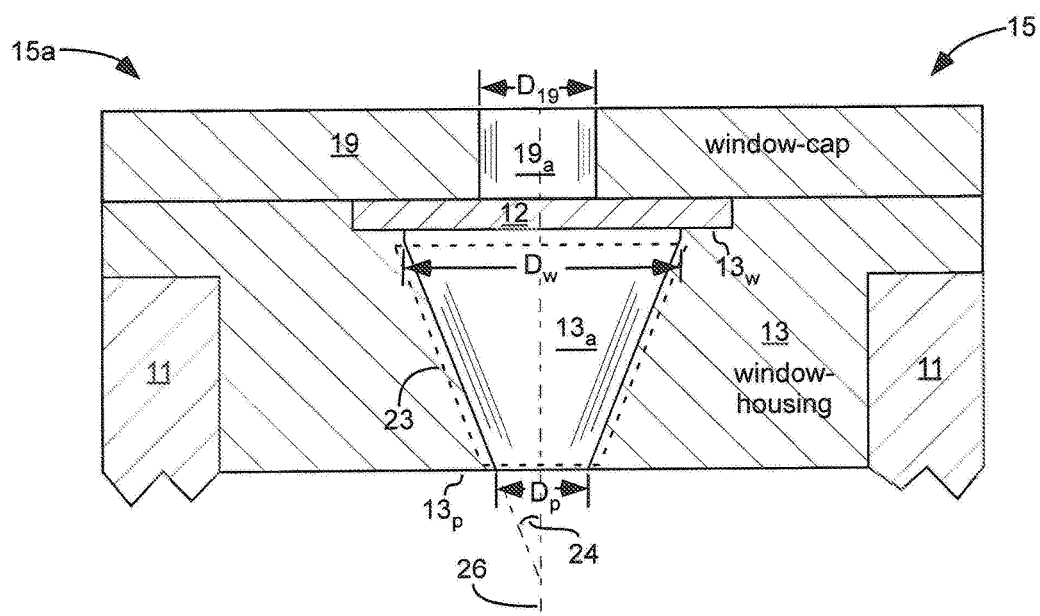
Figure 2B:
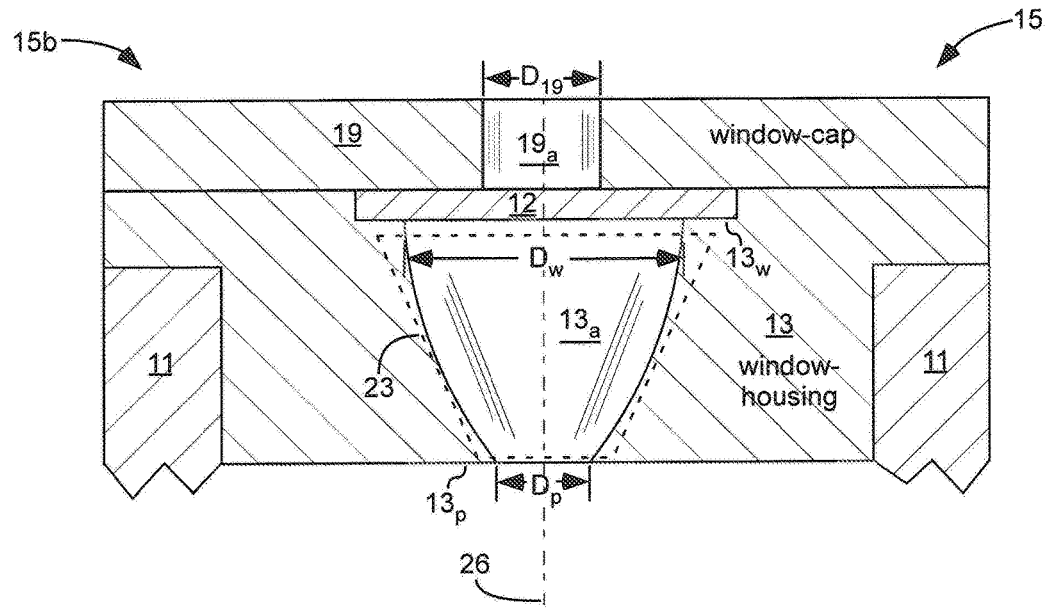
Figure 2C:
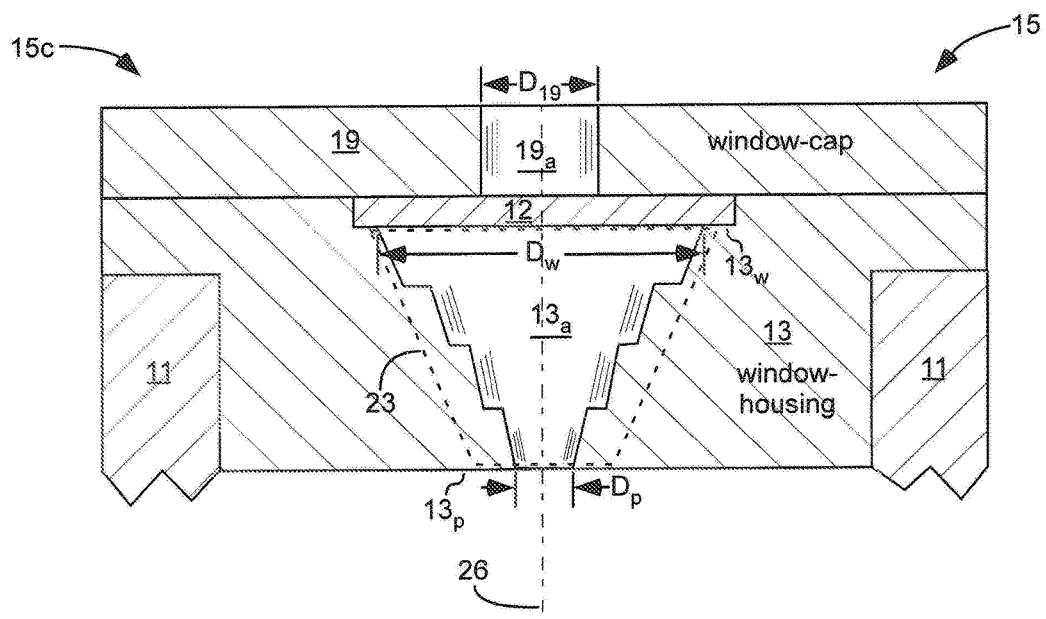

FIGS. 2a-c are a schematic, cross-sectional side-views of part of an x-ray source, showing an electrically-insulative enclosure 11 and an anode 15 with a window-housing 13, an x-ray window 12, and a window-cap 19, in accordance with an embodiment of the present invention.

Figure 3:
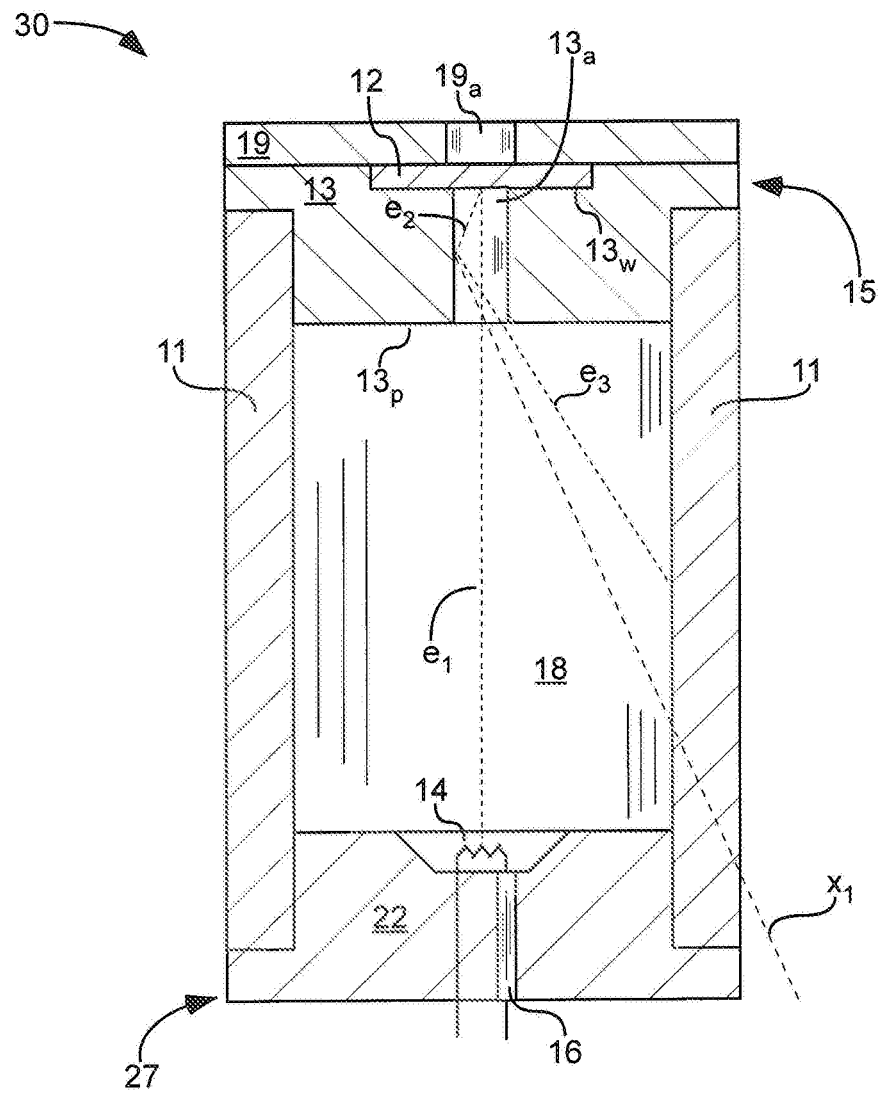

FIG. 3 is a schematic, cross-sectional side-view of a transmission-target x-ray tube 30, similar to x-ray tube 10, except for a different-shaped aperture $13_a$ of the window housing 13, in accordance with an embodiment of the present invention.

Figure 4:
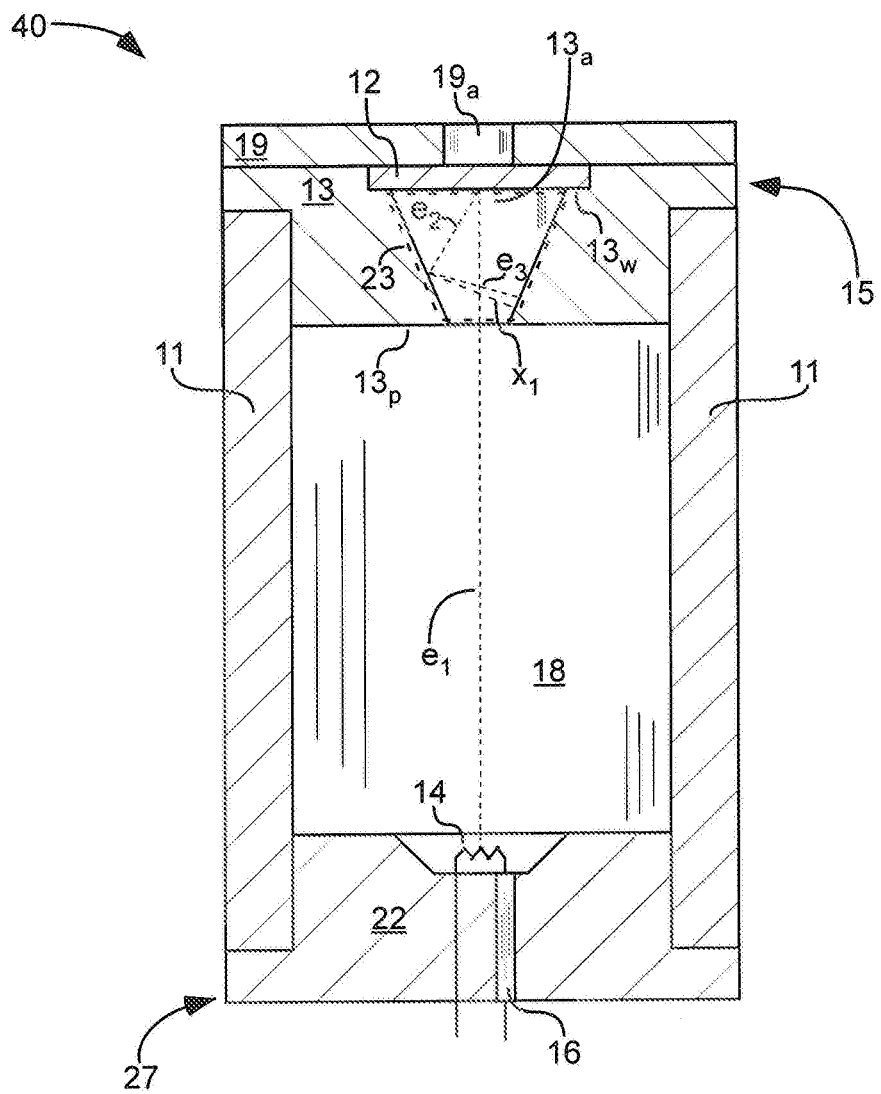

FIG. 4 is a schematic, cross-sectional side-view of a transmission-target x-ray tube 40, similar to x-ray tube 10, showing electron $e_3$ and x-ray $x_1$ captured within the aperture $13_a$ of the window-housing, in accordance with an embodiment of the present invention.

Figure 5:
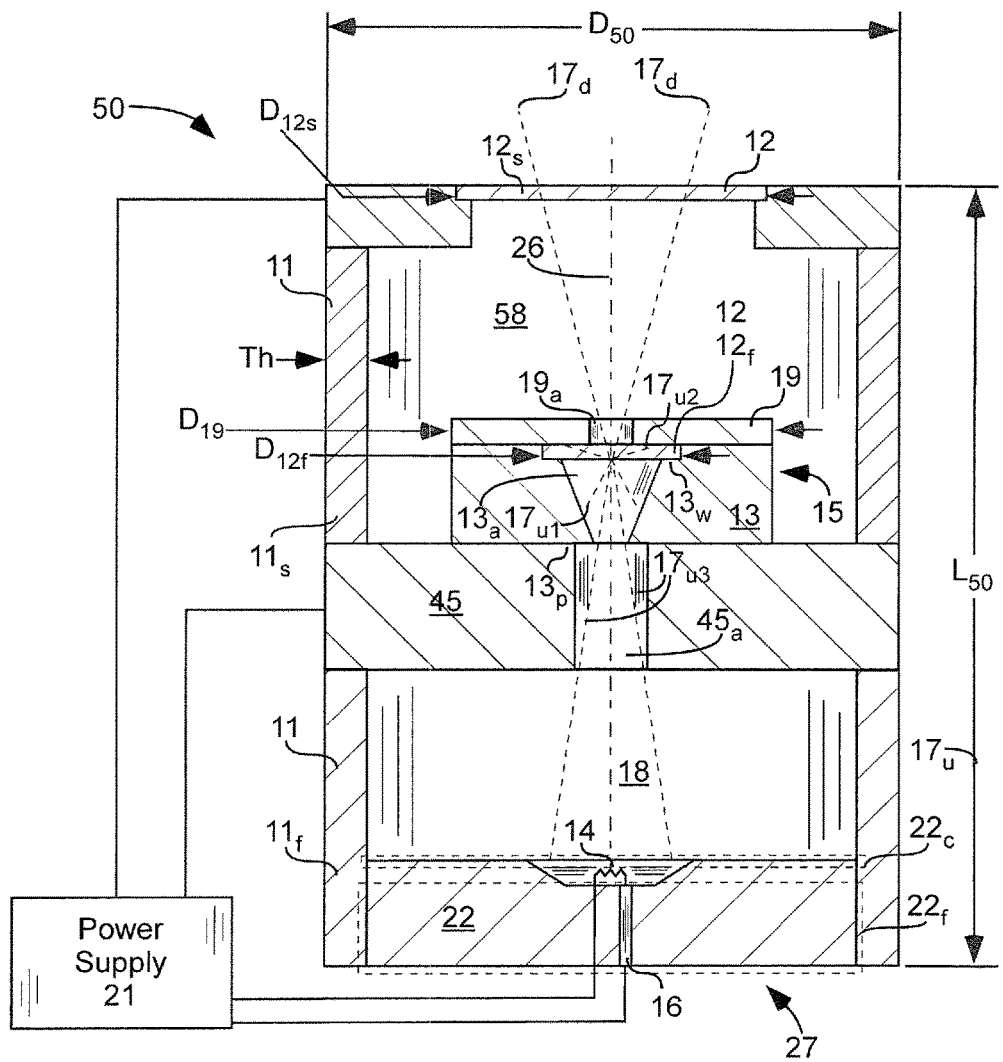

FIG. 5 is a schematic, cross-sectional side-view of an x-ray source including a transmission-target x-ray tube 50 and a power supply 21. The transmission-target x-ray tube 50 includes a cathode 27 with an electron-emitter 14; an anode 15 with a window-housing 13, a window-cap 19, and a first x-ray window $12_f$ and a second x-ray window $12_s$, in accordance with an embodiment of the present invention.

DEFINITIONS

As used herein, the term "electron-beam diameter" ($D_e$) means a diameter of the electron-beam that includes 99% of the electrons.

As used herein, the term "evacuated" means a vacuum such as is typically used for x-ray tubes.

DETAILED DESCRIPTION

Illustrated in FIGS. 1, 3, 4, & 5 are transmission-target x-ray tubes 10, 30, 40, and 50 including a cathode 27 and an anode 15 which can be separated and electrically-isolated from each other by an electrically-insulative enclosure 11. Illustrated in FIGS. 2a-c are expanded views of the anode 15. The anode 15 can include a window-housing 13 and an x-ray window 12. The x-ray window 12 can be mounted on a window-mount $13_w$ portion of a window-housing 13. The x-ray window 12 can be configured for transmission of x-rays and can include a target material configured for production and emission of x-rays in response to impinging electrons. The cathode 27 can include an electron-emitter 14 capable of emitting electrons towards the target, material on the x-ray window 12. The electron-emitter 14 can face the target material on the x-ray window 12. Examples of target materials include tungsten, rhodium, silver, gold, and chromium. Examples of atomic numbers of the target material include at least 24 in one aspect and at least 40 in another aspect.

A proximal-end $13_p$ of the window-housing 13 can be located closer to the electron-emitter 14 than to the window-mount $13_w$. An aperture $13_a$ can extend through the window-housing 13 from the proximal-end $13_p$ to the window-mount $13_w$.

A window-cap 19 can be located at an opposite side of the x-ray window 12 and farther from the cathode 27 than the window housing 13. The x-ray window 12 can be sandwiched between the window-cap 19 and the window-housing 13. The window-cap 19 can include an aperture $19_a$ extending therethrough to allow transmission of x-rays in a desired direction $17_d$. The aperture $19_a$ of the window-cap 19 can be located on an opposite side of the x-ray window 12 from the aperture $13_a$ of the window-housing 13. A diameter $D_{19}$ of the aperture $19_a$ of the window-cap 19 can be small in order to shape an emitted x-ray beam. For example, a diameter $D_w$ of the aperture $13_a$ of the window-housing 13 at the window-mount $13_w$ can be at least 1.5 times larger than the diameter $D_{19}$ of the aperture $19_a$ of the window-cap 19.

As electrons impinge on the target, x-rays are generated and can emit in all directions (e.g. $4*\pi$ steradians). Often, it is desirable and safe for the x-rays to emit only in a single direction with limited steradian cone-angle (e.g. <0.5 steradians). FIG. 1 shows four directions of emitted x-rays: a desired direction $17_d$, a first undesired direction $17_{u1}$, a second undesired direction $17_{u2}$, and a third undesired direction $17_{u3}$. The x-ray tube 10 can include structures to block x-rays emitted in one or more of the undesired directions $17_{u1}$, $17_{u2}$, and $17_{u3}$.

The window-housing 13 can block x-rays emitted in the first undesired direction $17_{u1}$. The window-cap 19 can block x-rays emitted in the second undesired direction $17_{u2}$. A blocking-disk 22 can be associated with and electrically-coupled to the cathode 27. The blocking-disk 22 can block x-rays emitted in the third undesired direction $17_{u3}$.

The blocking-disk 22 can be sized and located to block at least 80% of x-rays in one aspect, at least 90% of x-rays in another aspect, or at least 95% of x-rays in another aspect, that are emitted from the x-ray window 12 through the aperture 13, of the window-housing 13 and into an evacuated-region 18 between the electron-emitter 14 and the anode 15. At least part $22_c$ of the blocking-disk 22 can be located closer to the anode 15, and at least part $22_f$ of the blocking-disk 22 can be located farther from the anode 15, than the electron-emitter 14, as measured along a path that is parallel to a longitudinal-axis 26 of the x-ray tube 10, 30, 40, or 50. The longitudinal-axis 26 can extend from the electron-emitter 14 through the aperture $13_a$ of the window-housing 13 and through the x-ray window 12.

The window-housing 13, the window-cap 19, and the blocking-disk 22 (blocking devices) can be electrically conductive. The blocking devices can have a material (high Z & high density) and thickness to shield x-rays. Because of the location, shape, quantity, and materials of the blocking devices, the overall size, weight, and cost of the x-ray source can be reduced.

For example, one or more of the blocking devices can have an average atomic number Z of at least 45 in one aspect, at least 55 in another aspect, at least 65 in another aspect, or at least 70 in another aspect; and can have an average density of at least 12 g/cm$^3$ in one aspect, at least 15 g/cm$^3$ in another aspect, at least 17 g/cm$^3$ in another aspect, or at least 18 g/cm$^3$ in another aspect. The term "average" in this context means an average of all materials of the blocking device. For example, the blocking devices can be made of 90% tungsten, 5% iron, and 5% nickel, and can have an average atomic number (Z) of: 0.9*74 (Z for W)+0.05*26 (Z for Fe)+0.05*28 (Z for Ni)=69.3.

The blocking devices can each be made of different materials or can be made of the same material. The blocking devices can be made of tungsten or a tungsten alloy, such as for example at least 80% tungsten in one aspect, at least 90% tungsten in another aspect, at least 95% tungsten in another aspect, or at least 99% tungsten in one aspect. Other likely materials in an alloy with the tungsten include nickel, iron, lead, and copper.

The aperture $13_a$ of the window-housing 13 can be shaped for improved operation and improved shielding of the x-ray tubes 10, 30, 40, and 50. The aperture $13_a$ can include an increasing-inner-diameter region 23 (see FIGS. 2a-c), which can include a smaller diameter $D_p$ closer to or at the proximal-end $13_p$ and a larger diameter $D_w$ closer to or at the window-mount $13_w$ ($D_w$ in FIG. 2 is the diameter at the window-mount $13_w$). The diameter of the aperture $13_a$ can increase linearly (see anode 15a in FIG. 2a), with a curved shape/non-linearly (see anode 15b in FIG. 2b), or in steps (see anode 15c in FIG. 2c) from the smaller diameter $D_p$ closer to the proximal-end $13_p$ to the larger diameter $D_w$ closer to the window-mount $13_w$. Sidewalls of the steps can be slanted for an increase in diameter, as shown in FIG. 2c, or can be parallel to the longitudinal-axis 26. The increasing-inner-diameter region 23 of the aperture $13_a$ can include a frustum shape. The shape of the increasing-inner-diameter region 23 can depend on manufacturing cost and intended application of the x-ray source. For example, for XRF analysis, a design that minimizes x-ray fluorescence from the window-housing 13 at the aperture $13_a$ being emitted out of the x-ray window 12, may be desirable.

The window-housing 13 of x-ray tube 30 in FIG. 3 lacks the increasing-inner-diameter region 23. The electron-emitter 14 can emit a first electron $e_1$ to the target material on the x-ray window 12 where it can be absorbed, causing release of a second electron $e_2$, which can impinge on a side of the aperture $13_a$, causing release of a third electron $e_3$ and an x-ray $x_1$. Because of the location of origin of this x-ray $x_1$, it can bypass the blocking-disk 22, and emit from the x-ray tube, possibly causing damage. The third electron $e_3$ can hit and adsorb onto an inside-surface of the electrically-insulative enclosure 11. If enough of such electrons $e_3$ adsorb onto this inside-surface, the x-ray tube 30 can fail due to a short circuit between the cathode 27 and the anode 15.

In contrast, as shown on x-ray tube 40 in FIG. 4, with an increasing-inner-diameter region 23 in the aperture $13_a$ of the window-housing 13, electrons (e.g. the third electron $e_3$) emitted from sides of the aperture $13_a$ are more likely to hit an opposite wall of the aperture $13_a$ and less likely to hit the inside-surface of the electrically-insulative enclosure 11. Also, x-rays (e.g. $x_1$) emitted from sides of the aperture $13_a$ are more likely to hit an opposite wall of the aperture $13_a$ and are less likely to escape from the x-ray tube 40.

The increasing-inner-diameter region 23 can have an angle 24 (see FIG. 2a), with respect to the longitudinal-axis 26, for optimal blocking of x-rays. It can be important that this angle 24 is not too steep, because if it is too steep, then (1) x-rays can pass through the window-housing 13 and (2) cooling of the x-ray tube may be impaired due to decreased mass of the window-housing 13. It can be important that this angle 24 is sufficiently steep in order to minimize the problems described above in reference to FIG. 3. For example, this angle 24 can be at least 10 degrees in one aspect, at least 15 degrees in another aspect, at least 20 degrees in another aspect, or at least 25 degrees in another aspect; and/or can be less than 30 degrees in one aspect, less than 35 degrees in another aspect, less than 40 degrees in another aspect, or less than 50 degrees in another aspect.

Another way to minimize or prevent electrons from hitting and adsorbing onto an inside-surface of the electrically-insulative enclosure 11 is proper selection of a diameter $D_p$ of the aperture $13_a$ at the proximal end $13_p$. If this diameter $D_p$ is too large, then electrons emitted from the target can pass through the aperture $13_a$, back towards the electron-emitter 14, and can, due to electric-field lines, curve towards and adsorb on the inside-surface of the electrically-insulative enclosure 11. If this diameter $D_p$ is too small, then electrons at the outer-diameter of the electron-beam can hit the window-housing 13. If this diameter $D_p$ is just right, then electric-fields can force most electrons emitted from the target, travelling back towards the electron-emitter, that pass through the aperture $13_a$, to make a 180° turn back towards the target. Thus, proper selection of this diameter $D_p$ can aid in shaping the electric-field for optimal operation of the x-ray tube.

For example, the diameter $D_p$ of the aperture $13_a$ at the proximal end $13_p$ can be, in relation to the electron-beam diameter ($D_e$—not shown in the figures) at the proximal-end $13_p$, of the aperture $13_a$, at least 1.5 times larger in one aspect ($D_p \geq 1.5*D_e$), at least 2 times larger in another aspect ($D_p \geq 2*D_e$), at least 2.5 times larger in another aspect ($D_p \geq 2.5*De$); and less than 3.5 times larger in one aspect ($D_p \leq 3.5*D_e$), less than 4 times larger in another aspect ($D_p \leq 4*D_e$), or less than 5 times larger in another aspect ($D_p \leq 5*D_e$). For example, the diameter $D_p$ of the aperture $13_a$ at the proximal end $13_p$ can be at least 10 micrometers in one aspect, at least 100 micrometers in another aspect, at least 500 micrometers in another aspect; and less than 1 millimeter in one aspect or less than 5 millimeters in another aspect.

X-ray tube 50 differs from x-ray tubes 10 and 30 in that x-ray tube 50 has both a first x-ray window $12_f$ and a second x-ray window $12_s$. The x-ray window 11 described above can be the first x-ray window $12_f$, and thus the first x-ray window $12_f$ can be associated with the anode 15, can have target material, and can be electrically-coupled to the anode 15. The first x-ray window $12_f$ can be located between the second x-ray window $12_s$ and the electron-emitter 14. The first x-ray window $12_f$ can be electrically-insulated from the second x-ray window $12_s$.

If wide-angle distribution of x-rays is desired, the second x-ray window $12_s$ can have a diameter $D_{12s}$ that is larger than a diameter $D_{12f}$ of the first window $12_f$. For example, the second x-ray window $12_s$ can have a diameter $D_{12s}$ that is at least 1.5 times larger in one aspect, at least 3 times larger in another aspect, or at least 6 times larger in another aspect, than a diameter $D_{12f}$ of the first window $12_f$.

The electrically-insulative enclosure 11 described above can be a first electrically-insulative enclosure $11_f$ and the x-ray tube 50 can further comprise a second electrically-insulative enclosure $11_s$. The second electrically-insulative enclosure $11_s$ can electrically-insulate the anode 15 (including the first x-ray window $12_f$ and the window-housing 13) from the second x-ray window $12_s$.

An electrically-conductive disk 45 can separate the first electrically-insulative enclosure 11 from the second electrically-insulative enclosure 11. The electrically-conductive disk 45 can support the window-housing 13 within the x-ray tube 50 and can be used as a heat-channel from the window-housing 13 to a heat sink; therefore it can be important for the electrically-conductive disk 45 to have a relatively-high thermal conductivity, such as for example at least 200 W/m*K in one aspect, at least 300 W/m*K in another aspect, or at least 350 W/m*K in another aspect. The electrically-conductive disk 45 can have an aperture $45_a$ therethrough that aligns with a longitudinal-axis 26 of the x-ray tube 50, the longitudinal-axis extending linearly from the electron-emitter 14 and through the aperture $13_a$ of the window-housing 13, the first x-ray window $12_f$, and the second x-ray window $12_s$.

The first electrically-insulative enclosure $11_f$ and/or the second electrically-insulative enclosure $11_s$ can have a relatively thick wall thickness Th to improve heat transfer. For example, this wall thickness Th can be at least 2 millimeters in one aspect, at least 2.5 millimeters in another aspect, at least 3 millimeters in another aspect, or at least 4 millimeters in another aspect.

There can be an evacuated-region 18 between the electron-emitter 14 and the first x-ray window $12_f$ and an evacuated-region 58 between the first x-ray window $12_f$ and the second x-ray window $12_s$, both of which can be linked by a channel or air path so that the entire x-ray tube may be evacuated from a single access point.

The x-ray tube 50 can be used for high voltage applications. The second x-ray window $12_s$ can be maintained at ground voltage, the anode 15 can be maintained at a very high, positive voltage (e.g. +60 kV), and the cathode can be maintained at a very low, negative voltage (e.g. −60 kV).

The x-ray tubes described herein can be small, lightweight, and can operate at high voltage and power. As shown in FIGS. 1 and 5, the x-ray tubes 10 & 50 can be electrically-coupled to a power supply 21, forming an x-ray source. The power supply 21 can be electrically coupled to the cathode 22, which can include electrical-connection(s) to the electron-emitter 14. One electrical-connection to the electron-emitter can be electrically-insulated from the cathode 27 (e.g. see electrically-insulative tube 16 in FIGS. 1, 3-5).

The blocking-disk 22 can have the same voltage as at least one part or end of the electron-emitter 14. Alternatively, there can be a small voltage differential between the electron-emitter 14 and the blocking-disk 22, such as for example less than 500 volts in one aspect and greater than 10 volts in another aspect, for electron-beam shaping and control, and the blocking-disk can have a separate electrical connection to the power supply 21.

The power supply 21 can be electrically coupled to the anode 15. The power supply 21 can provide, and the x-ray tube 10 or 50 can operate, at for example voltage differentials between the cathode 27 and the anode 15 of at least 50 kilovolts in one aspect, at least 75 kilovolts in another aspect, or at least 100 kilovolts in another aspect. The power supply 21 in FIG. 5 can provide, and the x-ray tube 50 can operate, at for example a voltage differential between the anode 15 and the second x-ray window $12_s$ of at least 30 kilovolts in one aspect, at least 45 kilovolts in another aspect, or at least 60 kilovolts in another aspect.

The x-ray sources described herein can operate at various power levels, such as for example providing x-rays with a power of at least 12 watts in one aspect, at least 15 watts in another aspect, at least 100 watts in another aspect, or at least 500 watts in another aspect. The x-ray sources described herein can operate at high power with air cooling. For example, the x-ray tubes 10 and 50 and the power supply 21 can operate continuously for a period of at least 20 hours at a power of at least 20 watts in one aspect or at least 100 watts in another aspect, with air cooling and without any liquid-cooling heat exchanger.

The x-ray tubes 10, 30, 40, and 50 can be small and lightweight. For example the x-ray tube 10 or 50 can have a length $L_{10}$ or $L_{50}$ of less than 50 millimeters; a maximum diameter $D_{10}$ or $D_{50}$ of less than 20 millimeters; and a weight of less than 200 grams. The weight, length, and diameter of the x-ray tube refer to these dimensions of the x-ray tube alone, without the power-supply or added electrically-insulative material (e.g. potting). The length $L_{10}$ or $L_{50}$ of the x-ray tube does not include electrical-connectors, i.e. portions of the x-ray source whose function is primarily supplying electrical power to the x-ray tube.

X-Ray Window

It can be important for the x-ray window 12 to be strong (especially strong enough to withstand a differential pressure of 1 atm) and allow a high percent transmission of x-rays. The x-ray window 12 can have sufficient thickness for strength, but not have a thickness that will cause excessive attenuation of x-rays. For example, the x-ray window 12 can have a thickness of at least 10 micrometers in one aspect or at least 100 micrometers in another aspect; and less than 500 micrometers in one aspect, less than 1 millimeter in another aspect, or less than 5 millimeters in another aspect. The x-ray window 12 can face a vacuum on one side and air or vacuum on an opposite side.

Material of construction for the x-ray window 12 can include materials with an atomic number ≤14 in one aspect, ≤6 in another aspect, or ≤4 in another aspect; and can, include beryllium, hydrogen, oxygen, carbon, silicon, and nitrogen.

A differential pressure across the thin x-ray window 12 can cause it to bow or deflect, which can damage the x-ray window, causing a change in electron-beam focusing. Thus, it can be important to minimize the deflection distance. The x-ray window 12 described herein can be made sufficiently strong and thus can have a relatively small deflection distance. For example, the x-ray window 12 can have a deflection distance of less than 400 micrometers in one aspect, less than 300 micrometers in another aspect, less than 200 micrometers in another aspect, or less than 100 micrometers in another aspect, with one atmosphere differential pressure across the x-ray window 12.

It can be important for the x-ray window 12 to have a high transmissivity of x-rays, including a high transmission of low-energy x-rays. For example, the x-ray window 12 can have a transmissivity of greater than 50% in one aspect, a transmissivity of greater than 60% in another aspect, a transmissivity of greater than 70% in another aspect, a transmissivity of greater than 74% in another aspect, or a transmissivity of greater than 80% in another aspect, for x-rays having an energy of 1.74 keV.

For some applications, it can be important for the x-ray window to block visible and infrared light transmission, such as for example to avoid creating undesirable noise in sensitive instruments. For example, the x-ray window 12 described herein can have a transmissivity of less than 10% in one aspect, less than 3% in another aspect, or less than 2% in another aspect, for visible light at a wavelength of 550 nanometers. For example regarding infrared light, the x-ray window 12 described herein can have a transmissivity of less than 10% in one aspect, less than 4% in another aspect, or less than 3% in another aspect, for infrared light at a wavelength of 800 nanometers.

The x-ray window 12 can include some or all of the properties (e.g. low deflection, high x-ray transmissivity, low visible and infrared light transmissivity) of the x-ray window described in U.S. Patent Publication Number US 20150303024, which is incorporated herein by reference in its entirety.

What is claimed is:

1. A transmission-target x-ray tube comprising:
   a) a cathode including an electron-emitter capable of emitting electrons towards a target material on an x-ray window;
   b) an anode including a window-housing and the x-ray window, with the x-ray window mounted on a window-mount portion of the window-housing;
   c) an electrically-insulative enclosure carrying the cathode and the anode and electrically-insulating the cathode from the anode;
   d) the x-ray window being configured for transmission of x-rays and including the target material configured for production and emission of x-rays in response to impinging electrons; and
   e) the window-housing including:
      i) a proximal-end closer to the electron-emitter than an other end of the window-housing;
      ii) a distance between the window-mount and the electron-emitter is farther than a distance between the window-mount and the proximal-end of the window housing;
      iii) an aperture:
         extending through the window-housing from the proximal-end to the window-mount;
         including an increasing-inner-diameter region with a smaller diameter closer to the proximal-end and a larger diameter closer to the window-mount; and
         having an angle in the increasing-inner-diameter region that is between 15 degrees and 35 degrees with respect to a longitudinal-axis of the x-ray tube, the longitudinal-axis extending from the electron-emitter through the aperture of the window-housing and through the x-ray window;
      iv) an average atomic number of at least 45; and
      v) an average density of at least 12 g/cm³;
   f) $2*D_e \leq D_p \leq 4*D_e$, where $D_p$ is a diameter of the aperture of the window-housing at the proximal-end and $D_e$ is an electron-beam diameter at the proximal-end of the aperture of the window-housing.

2. A transmission-target x-ray tube comprising:
   a) a cathode including an electron-emitter capable of emitting electrons towards a target material on an x-ray window;
   b) an anode including a window-housing, a window-cap, and the x-ray window, with the x-ray window mounted on a window-mount portion of the window-housing and sandwiched between the window-cap and the window-housing;
   c) an electrically-insulative enclosure carrying the cathode and the anode and electrically-insulating the cathode from the anode;
   d) the x-ray window being configured for transmission of x-rays and including the target material configured for production and emission of x-rays in response to impinging electrons;
   e) the window-cap including:
      i) an aperture extending therethrough;
      ii) an average atomic number of at least 45; and
      iii) an average density of at least 12 g/cm³;
   f) the window-housing including:
      i) a proximal-end closer to the electron-emitter than an other end of the window-housing;
      ii) a distance between the window-mount and the electron-emitter is farther than a distance between the window-mount and the proximal-end of the window housing;
      iii) an aperture, extending through the window-housing from the proximal-end to the window-mount, and including an increasing-inner-diameter region with a smaller diameter closer to the proximal-end and a larger diameter closer to the window-mount;

iv) an average atomic number of at least 45; and
v) an average density of at least 12 g/cm³;
g) a blocking-disk, associated with and electrically-coupled to the cathode, and having an average atomic number of at least 45 and an average density of at least 12 g/cm³.

3. A transmission-target x-ray tube comprising:
a) a cathode including an electron-emitter capable of emitting electrons towards a target material on an x-ray window;
b) an anode including a window-housing and the x-ray window, with the x-ray window mounted on a window-mount portion of the window-housing;
c) an electrically-insulative enclosure carrying the cathode and the anode and electrically-insulating the cathode from the anode;
d) the x-ray window being configured for transmission of x-rays and including the target material configured for production and emission of x-rays in response to impinging electrons; and
e) the window-housing including:
   i) a proximal-end closer to the electron-emitter than an other end of the window-housing;
   ii) a distance between the window-mount and the electron-emitter is farther than a distance between the window-mount and the proximal-end of the window housing;
   iii) an aperture, extending through the window-housing from the proximal-end to the window-mount, including an increasing-inner-diameter region with a smaller diameter closer to the proximal-end and a larger diameter closer to the window-mount, and having an angle in the increasing-inner-diameter region that is at least 20 degrees with respect to a longitudinal-axis of the x-ray tube, the longitudinal-axis extending from the electron-emitter through the aperture of the window-housing and through the x-ray window;
   iv) an average atomic number of at least 45; and
   v) an average density of at least 12 g/cm³.

4. The x-ray tube of claim 3, wherein $2*D_e \leq D_p \leq 4*D_e$, where $D_p$ is a diameter of the aperture of the window-housing at the proximal-end and $D_e$ is an electron-beam diameter at the proximal-end of the aperture of the window-housing.

5. The x-ray tube of claim 3, wherein the angle of the aperture of the window-housing in the increasing-inner-diameter region is less than 35 degrees.

6. The x-ray tube of claim 3, further comprising a blocking-disk, associated with and electrically-coupled to the cathode, and having an average atomic number of at least 45 and an average density of at least 12 g/cm³.

7. The x-ray tube of claim 6, wherein the blocking-disk is sized and located to block at least 80% of x-rays that are emitted from the x-ray window through the aperture of the window-housing and reflected back into an evacuated-region between the electron-emitter and the anode.

8. The x-ray tube of claim 6, wherein:
a) the x-ray tube is part of an x-ray source and the x-ray source further comprises a power supply;
b) the power supply is electrically-coupled to the electron-emitter, the blocking-disk, and to the anode; and
c) the power supply is configured to provide $10V \leq \Delta V \leq 500$ V, where V means volts and $\Delta V$ means a voltage differential between the electron-emitter and the blocking-disk.

9. The x-ray tube of claim 6, wherein at least part of the blocking-disk is located closer to the anode than the electron-emitter and at least part of the blocking-disk is located farther from the anode than the electron-emitter, as measured along a path that is parallel to a longitudinal-axis of the x-ray tube, the longitudinal-axis extending from the electron-emitter through the aperture of the window-housing and through the x-ray window.

10. The x-ray tube of claim 3, wherein:
a) the x-ray tube is part of an x-ray source and the x-ray source further comprises a power supply;
b) the power supply is electrically-coupled to the cathode and to the anode;
c) the power supply is capable of providing, and the x-ray tube is capable of operating at:
   i) a voltage differential of at least 50 kilovolts between the cathode and to the anode; and
   ii) a power of at least 500 watts; and
d) the x-ray tube has:
   i) a length of less than 50 millimeters; and
   iii a maximum diameter of less than 20 millimeters.

11. The x-ray tube of claim 10, wherein the x-ray tube and the power supply are capable of operating continuously for a period of at least 20 hours at a power of at least 100 watts with air cooling and without any liquid-cooling heat exchanger.

12. The x-ray tube of claim 3, wherein an average atomic number of the window-housing is at least 65 and an average density of the window-housing is at least 17 g/cm³.

13. The x-ray tube of claim 3, further comprising a window-cap, wherein:
a) the x-ray window is sandwiched between the window-cap and the window-housing; and
b) the window-cap includes:
   i) an aperture extending therethrough;
   ii) an average atomic number of at least 45; and
   iii) an average density of at least 12 g/cm³.

14. The x-ray tube of claim 3, wherein:
a) the x-ray window is a first x-ray window;
b) the x-ray tube further comprises a second x-ray window;
c) the first x-ray window is located between the second x-ray window and the electron-emitter; and
d) the first x-ray window is electrically-insulated from the second x-ray window.

15. The x-ray tube of claim 14, wherein:
a) the electrically-insulative enclosure is a first electrically-insulative enclosure;
b) the x-ray tube further comprises a second electrically-insulative enclosure and an electrically-conductive disk;
c) the second electrically-insulative enclosure electrically-insulates the first x-ray window from the second x-ray window;
d) the electrically-conductive disk:
   i) separates the first electrically-insulative enclosure from the second electrically-insulative enclosure;
   ii) has a thermal conductivity of at least 300 W/m*K;
   iii) supports the window-housing within the x-ray tube;
   iv) includes an aperture therethrough that aligns with a longitudinal-axis of the x-ray tube, the longitudinal-axis extending linearly from the electron-emitter and through the aperture of the window-housing, the first x-ray window, and the second x-ray window.

16. The x-ray tube of claim 15, wherein:
a) the first electrically-insulative enclosure has a wall thickness of at least 2.5 millimeters; and b) the second electrically-insulative enclosure has a wall thickness of at least 2.5 millimeters.

17. The x-ray tube of claim 14, wherein:
a) the x-ray tube is part of an x-ray source, the x-ray source further comprising a power supply;
b) the power supply is electrically-coupled to the cathode, the anode, and to the second x-ray window; and
c) the power supply is capable of providing a voltage differential of at least:
   i) 75 kilovolts between the cathode and the anode; and
   ii) 30 kilovolts between the anode and the second x-ray window.

18. The x-ray source of claim 17, wherein:
a) the x-ray source is capable of providing x-rays with a power of at least 12 watts; and
b) the x-ray tube has a weight of less than 200 grams.

19. The x-ray tube of claim 18, wherein the x-ray tube and power supply are capable of operating continuously for a period of at least 20 hours at a power of at least 15 watts with air cooling and without any liquid-cooling heat exchanger.

20. The x-ray tube of claim 3, wherein the angle of the aperture of the window-housing in the increasing-inner-diameter region is at least 25 degrees.

* * * * *